United States Patent
Park et al.

(10) Patent No.: US 9,793,476 B2
(45) Date of Patent: Oct. 17, 2017

(54) APPARATUS AND METHOD FOR TREATING A SUBSTRATE

(71) Applicant: WONIK IPS CO., LTD., Pyeongtaek-Si, Gyeonggi-Do (KR)

(72) Inventors: Ju Hwan Park, Hwaseong-Si (KR); Dong Ho Ryu, Pyeongtaek-Si (KR); Byung Chul Cho, Hwaseong-Si (KR)

(73) Assignee: WONIK IPS CO., LTD. (KR)

( * ) Notice: Subject to any disclaimer, the term of this patent is extended or adjusted under 35 U.S.C. 154(b) by 70 days.

(21) Appl. No.: 14/355,206

(22) PCT Filed: Oct. 30, 2012

(86) PCT No.: PCT/KR2012/008969
§ 371 (c)(1),
(2) Date: Sep. 10, 2014

(87) PCT Pub. No.: WO2013/066015
PCT Pub. Date: May 10, 2013

(65) Prior Publication Data
US 2015/0037929 A1    Feb. 5, 2015

(30) Foreign Application Priority Data
Oct. 31, 2011 (KR) .......... 10-2011-0112128

(51) Int. Cl.
*H01L 45/00* (2006.01)
*C23C 16/50* (2006.01)
*C23C 16/52* (2006.01)

(52) U.S. Cl.
CPC .......... *H01L 45/1616* (2013.01); *C23C 16/50* (2013.01); *C23C 16/52* (2013.01);
(Continued)

(58) Field of Classification Search
CPC .................. H01L 45/1616; C23C 16/50
(Continued)

(56) References Cited

U.S. PATENT DOCUMENTS

| 6,093,645 | A | 7/2000 | Ameen et al. |
| 6,294,832 | B1 * | 9/2001 | Yeh .................. H01L 21/02131 257/751 |

(Continued)

FOREIGN PATENT DOCUMENTS

| CN | 101123219 A | 2/2008 |
| CN | 101162758 A | 4/2008 |

(Continued)

OTHER PUBLICATIONS

International Search Report & Written Opinion for PCT/KR2012/008969, dated Feb. 27, 2013.

*Primary Examiner* — Moazzam Hossain
(74) *Attorney, Agent, or Firm* — Renaissance IP Law Group LLP (57) ABSTRACT

Provided are a substrate treating apparatus and method of manufacturing a phase-change layer having superior deposition characteristics. The substrate treating method of manufacturing a phase-change memory includes forming a bottom electrode on a substrate on which a pattern is formed, performing surface treating for removing impurities generated or remaining on a surface of the substrate while the bottom electrode is formed, performing nitriding on the surface of the substrate from which the impurities are removed, and successively depositing a phase-change layer and a top electrode on the bottom electrode. The substrate treating apparatus for manufacturing a phase-change memory includes a load lock chamber into/from which a plurality of substrates are loaded or unloaded, the load lock chamber being converted between an atmosphere state and a vacuum state, a nitriding chamber in which nitriding is (Continued)

performed on a surface of a substrate on which a bottom electrode is disposed, the nitriding chamber being coupled to one side of a plurality of sides of the vacuum transfer chamber, and a process chamber in which a phase-change layer is deposited on the surface of the substrate on which nitriding is performed in the nitriding process chamber, the process chamber being coupled to one of the plurality of sides of the vacuum transfer chamber.

13 Claims, 6 Drawing Sheets

(52) U.S. Cl.
CPC .......... *H01L 45/06* (2013.01); *H01L 45/1233* (2013.01); *H01L 45/1253* (2013.01); *H01L 45/143* (2013.01); *H01L 45/144* (2013.01); *H01L 45/148* (2013.01); *H01L 45/16* (2013.01)

(58) Field of Classification Search
USPC ............... 438/102; 257/E45.002; 118/719
See application file for complete search history.

(56) References Cited

U.S. PATENT DOCUMENTS

| | | | | |
|---|---|---|---|---|
| 2004/0043593 | A1* | 3/2004 | Ikeda | H01L 21/76802 438/587 |
| 2006/0024950 | A1* | 2/2006 | Choi | H01L 21/76877 438/626 |
| 2007/0117398 | A1* | 5/2007 | Okada | C23C 16/4405 438/710 |
| 2007/0232021 | A1* | 10/2007 | Eun | H01L 21/76224 438/424 |
| 2008/0055969 | A1* | 3/2008 | Liu | G11C 13/0004 365/163 |
| 2008/0116543 | A1* | 5/2008 | Govindarajan | B82Y 10/00 257/639 |
| 2008/0210922 | A1* | 9/2008 | Lee | G11C 13/0004 257/3 |
| 2008/0210924 | A1* | 9/2008 | Shin | H01L 27/2436 257/4 |
| 2008/0233764 | A1* | 9/2008 | Takahashi | C23C 16/401 438/785 |
| 2008/0308911 | A1 | 12/2008 | Okamoto | |
| 2008/0315174 | A1 | 12/2008 | Kang et al. | |
| 2009/0208650 | A1* | 8/2009 | Narushima | C23C 16/14 427/250 |
| 2010/0230653 | A1* | 9/2010 | Chen | H01L 45/06 257/4 |
| 2010/0308463 | A1* | 12/2010 | Yu | H01L 21/02074 257/753 |

FOREIGN PATENT DOCUMENTS

| | | |
|---|---|---|
| JP | 2001523043 A | 11/2001 |
| JP | 2003163285 A | 6/2003 |
| JP | 2008288408 A | 11/2008 |
| JP | 200921565 A | 1/2009 |
| JP | 201177526 A | 4/2011 |
| KR | 20040086384 A | 10/2004 |
| KR | 100538806 | 12/2005 |
| KR | 20060012168 A | 2/2006 |
| KR | 20090091107 A | 8/2009 |
| KR | 20090099340 A | 9/2009 |
| KR | 20100006680 A | 1/2010 |
| KR | 20110035061 A | 4/2011 |
| WO | 9925012 A1 | 5/1999 |

* cited by examiner

APPARATUS AND METHOD FOR TREATING A SUBSTRATE

CROSS-REFERENCE TO RELATED APPLICATION

This application claims priority to Korean Patent Application No. 10-2011-0112128 filed on Oct. 31, 2011 and all the benefits accruing therefrom under 35 U.S.C. §119, the contents of which are incorporated by reference in their entirety.

BACKGROUND

The present disclosure relates to a substrate treating apparatus for depositing a phase-change layer of a phase change random access memory (PRAM) and a substrate treating method, and more particularly, to a substrate treating apparatus and method for manufacturing a phase-change layer having superior deposition characteristics.

The next generation non-volatile memories for supplementing faults of existing non-volatile memories such as dynamic random access memories (DRAMs), static random access memories (SRAMs), and flash memories are being proposed. Ferroelectrics random access memories (FRAMs), magnetic random access memories (MRAMs), phase-change random access memories (PRAMs), and the like may be used as the next generation non-volatile memories.

Particularly, the phase-change RAMs (PRAMs) that have received great attention lately as one of the next generation non-volatile memories may be manufactured by using germanium-antimony-tellurium (GST; $Ge_2Sb^2Te_5$) thin film as a main component. Here, phase-change RAM (PRAM) technologies may be technologies using an optical and electrical switching phenomenon between amorphous and crystalline phases through reversible transition from a crystalline state into an amorphous state that relates to resistivity transition of a film material. That is, a resistance or current difference between the amorphous and crystalline phases according to electrical signals may be introduced as the concept of memory. The GST thin film may be deposited through physical vapor deposition (PVD). In recent years, for reasons of commercial high-speed manufacturing and performance, the GST thin film may be deposited by using methods such as chemical vapor deposition (CVD) and atomic layer deposition (ALD).

However, it may be difficult to grow a phase-change layer that is the high quality GST thin film at a low temperature through the CVD and ALD. Particularly, when the phase-change layer is deposited after a bottom electrode is formed, following limitations may occur.

Figure 1:
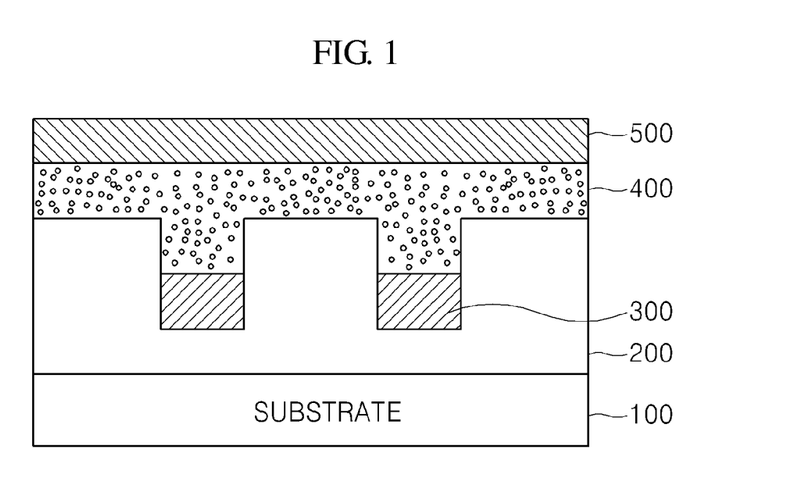
FIG. 1 is a cross-sectional view of a phase-change memory including a phase-change layer.

The above-described limitations will be described with reference to FIG. 1 that illustrates a cross-section of a phase-change memory including the phase-change layer.

First, in a process of depositing a phase-change memory on a substrate, a dielectric 200 is deposited on a substrate 100. A bottom electrode contact hole is formed on the dielectric 200 by using a mask pattern to deposit a nitride layer such as TiN or TiSiN.

Thereafter, unnecessary portions remaining except for a contact hole in which a bottom electrode 300 will be formed may be removed by an etching process to form the bottom electrode 300. Then, PVD or CVD may be performed on the bottom electrode 300 and the dielectric 200 to successively grow a phase-change layer 400 and an upper electrode 500.

As described above, the etching process has to be performed before the phase-change layer is deposited on the nitride layer. Here, an oxide layer and remaining materials which are generated after the etching process is performed may serve as a cause of a reduced switching rate of the phase-change memory PRAM. To improve the above-described limitation, a surface of the substrate may be treated by using $H_2$ plasma.

However, when the $H_2$ plasma surface treatment is performed as described above, hydrogen H may be bonded to surfaces of the thin films of the bottom electrode and the dielectric 200. In the case where the phase-change layer 400 is deposited by the PVD, an influence due to the bonding of the hydrogen H on the surfaces of the thin films may not be so large when the phase-change layer is deposited. However, in the case where the phase-change layer 400 is deposited by the CVD, deposition characteristics due to the bonding of the hydrogen H on the surfaces of the thin films may be changed. That is, deposition characteristics of the phase-change layer 400 due to the bonding of the hydrogen H on the surfaces of the thin films may be changed to significantly affect an incubation time and directivity, thereby having a bad influence on mass productivity.

PRIOR ART DOCUMENTS: Korean Patent publication No. 10-2009-0091107

SUMMARY

The present disclosure provides a substrate treating apparatus and method for depositing a phase-change memory. The present disclosure also provides a substrate treating apparatus and method, which are capable of preventing deposition characteristics of a phase-change layer in a phase-change memory from being changed by a plasma cleaning process that is performed on a bottom electrode. The present disclosure also provides a substrate treating apparatus and method, which are capable of preventing an incubation time and directivity of a phase-change layer from being affected by a plasma cleaning process that is performed on a bottom electrode. The present disclosure also provides a substrate treating apparatus and method for improving mass-productivity of a phase-change memory.

In accordance with an exemplary embodiment, a substrate treating method for manufacturing a phase-change memory includes: forming a bottom electrode on a substrate on which a pattern is formed; performing surface treating for removing impurities generated or remaining on a surface of the substrate while the bottom electrode is formed; performing nitriding on the surface of the substrate from which the impurities are removed; and successively depositing a phase-change layer and a top electrode on the bottom electrode.

The forming of the bottom electrode may include: forming a bottom electrode contact hole in which the bottom electrode is formed after a dielectric is deposited on the substrate; depositing a nitride layer on the surface of the substrate in which the contact hole is formed; and removing the nitride layer remaining except for the nitride layer formed in the bottom electrode contact hole.

The surface treating may include plasma treating using an H2-containing gas. The nitriding may include annealing or plasma treating under a nitrogen-containing atmosphere.

The annealing may be performed by allowing at least one of $N_2$, $N_2O$, and $NH_3$ to flow. The annealing may be performed under conditions such as a pressure of approximately 8 Torr or more and a temperature of approximately 700° C. or more. Also, the annealing may be performed by allowing at least one of $N_2$, $N_2O$, and $NH_3$ to flow at a flow rate of approximately 1000 sccm for approximately 10 minutes.

The plasma treating may be performed by generating a plasma from at least one of N2, N2O, and NH3. The plasma treating may be performed at a temperature of approximately 300° C. Also, the phase-change layer is formed of a compound including at least one of germanium (Ge), antimony (Sb), or tellurium (Te).

In accordance with another exemplary embodiment, a substrate treating apparatus for manufacturing a phase-change memory includes: a load lock chamber into/from which a plurality of substrates are loaded or unloaded, the load lock chamber being converted between an atmosphere state and a vacuum state; a vacuum transfer chamber of which the inside is maintained in a vacuum state, the vacuum transfer chamber having a polygonal shape, wherein one side of a plurality of sides of the vacuum transfer chamber is coupled to the load lock chamber, and a substrate transfer robot for transferring the substrate is disposed in the vacuum transfer chamber; and a plasma process chamber in which nitriding is performed on a surface of a substrate on which a surface-treated bottom electrode is disposed and a phase-change layer is deposited on the nitrided surface, the plasma process chamber being coupled to one side of the plurality of sides of the vacuum transfer chamber, wherein the nitriding and depositing are successively performed in the same chamber.

In accordance with yet another exemplary embodiment, a substrate treating apparatus for manufacturing a phase-change memory includes: a load lock chamber into/from which a plurality of substrates are loaded or unloaded, the load lock chamber being converted between an atmosphere state and a vacuum state; a nitriding chamber in which nitriding is performed on a surface of a substrate on which a bottom electrode is disposed, the nitriding chamber being coupled to one side of a plurality of sides of the vacuum transfer chamber; and a process chamber in which a phase-change layer is deposited on the surface of the substrate on which nitriding is performed in the nitriding process chamber, the process chamber being coupled to one of the plurality of sides of the vacuum transfer chamber.

The nitriding chamber may include a plasma chamber in which the nitriding is performed by using at least one of $N_2$, $N_2O$, and $NH_3$ as a plasma gas or an annealing chamber in which the nitriding is performed by allowing at least one of $N_2$, $N_2O$, and $NH_3$ to flow while the inside of the chamber is maintained at a specific temperature.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the figures, like reference numerals refer to like elements throughout.

Figure 2:
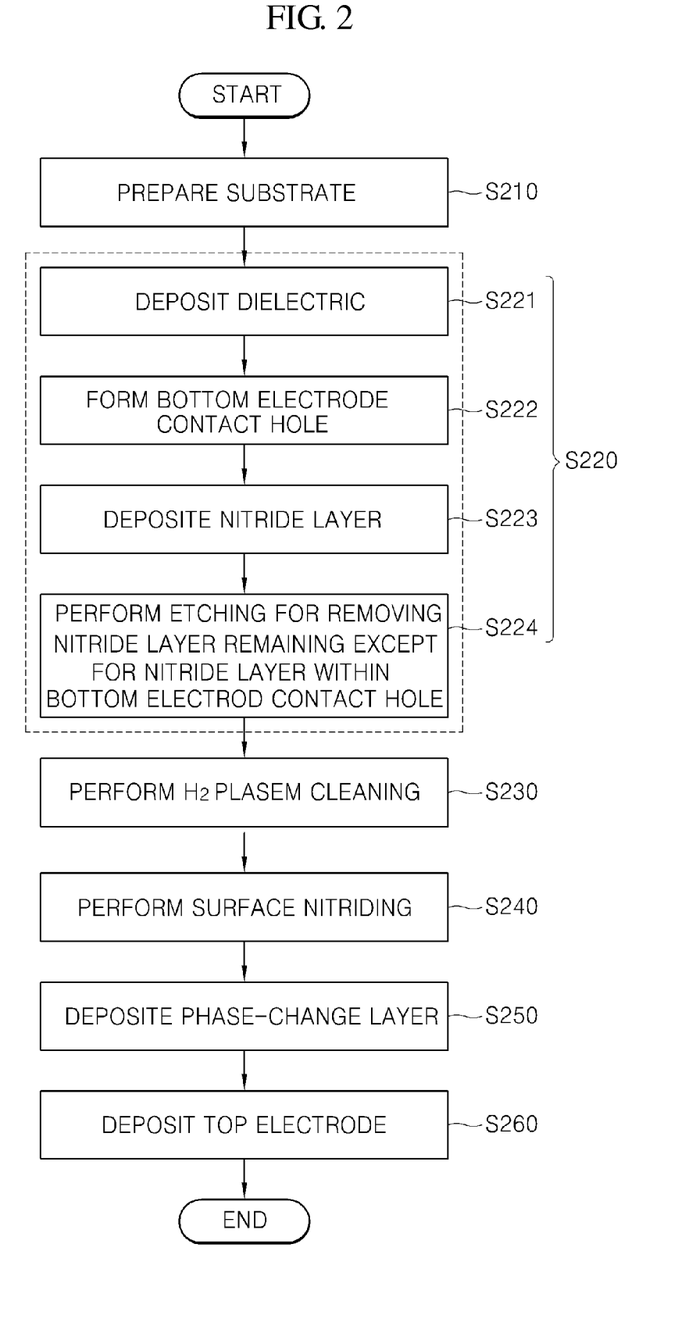
FIG. 2 is a flowchart illustrating a process of depositing a PRAM material in accordance with an exemplary embodiment.
Figure 3:
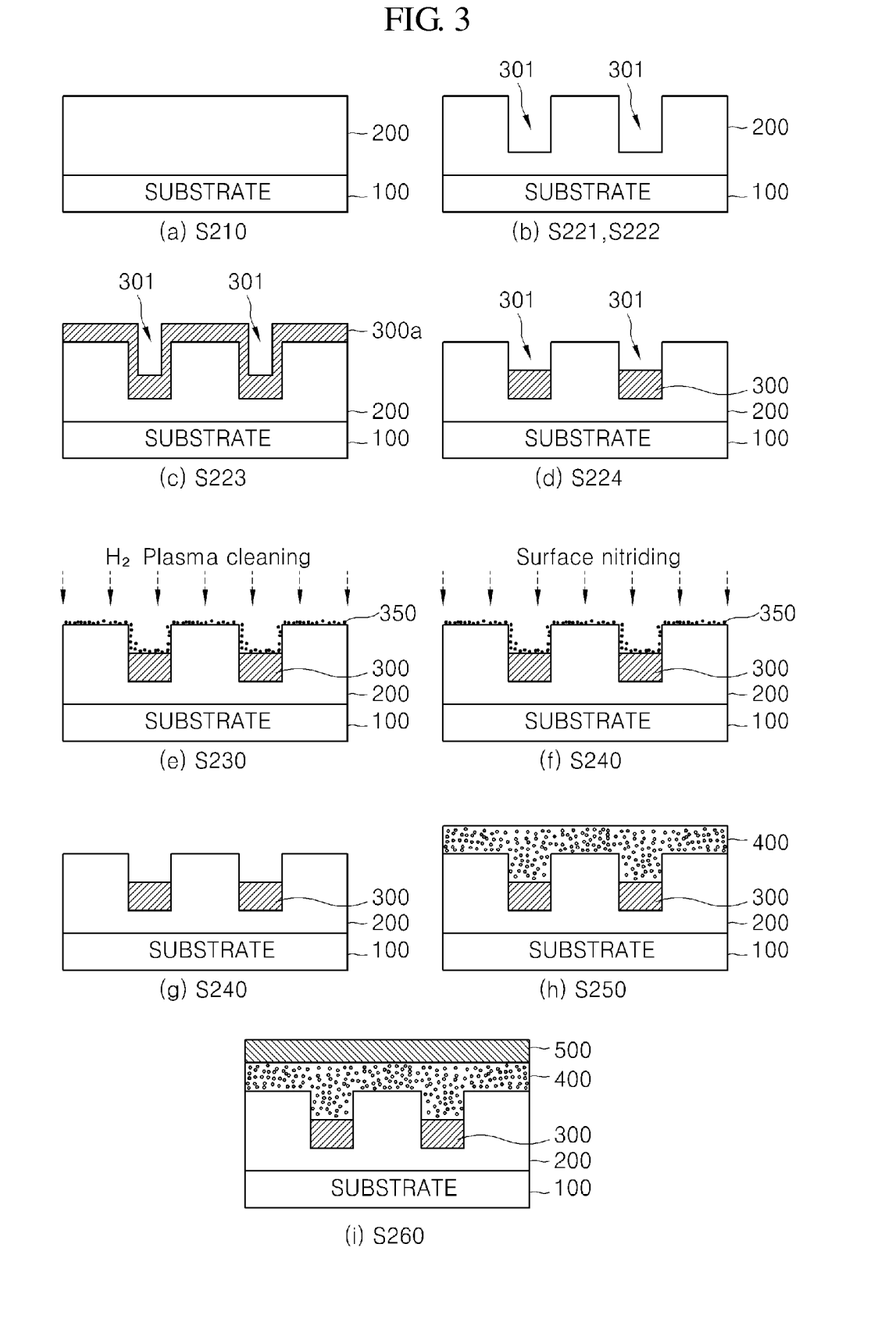
FIG. 3 is a view illustrating a process of depositing the PRAM material in accordance with an exemplary embodiment.

FIG. 2 is a flowchart illustrating a process of depositing a PRAM material in accordance with an exemplary embodiment, and FIG. 3 is a view illustrating a process of depositing the PRAM material in accordance with an exemplary embodiment.

A phase-change RAM (PRAM) includes a phase-change layer that be changed in crystalline state according to heat generated from applied current. At present, a chalcogenide compound (GST: Ge—Sb—Te) including germanium (Ge), antimony (Sb), and tellurium (Te) may be mainly used for forming the phase-change layer applied to the PRAM. The phase-change layer such as a GSP thin film may be changed in crystalline state by heat generated according to the intensity of supplied current and a time variation. Since the phase-change layer has high specific resistance in an amorphous state and low specific resistance in the crystalline state, the phase-change layer may be used as a data storage medium of a memory device.

To form the phase-change layer on the PRAM, a substrate 100 is prepared first in operation S210. The substrate may have a size of approximately 200 mm or approximately 300 mm. In operation S220, a bottom electrode is formed on the substrate 100 on which a pattern is formed.

To form the bottom electrode in the operation S220, an SiN dielectric 200 is formed on the substrate 100 as illustrated in FIG. 3A in operation S221. Although not shown, an access device may be disposed between the substrate 100 and the dielectric 200. For example, a PN diode may be used as the access device. The bottom electrode BE is formed within the dielectric 200 and selectively connected to the access device.

In operation S222, a bottom electrode contact hole 301 is formed at a position, in which the bottom electrode BE will be formed, within the dielectric 200 by using a mask pattern as illustrated in FIG. 3B to form the bottom electrode BE. Thereafter, as illustrated in FIG. 3C, a conductive layer that is a nitride layer 300a formed of TiN or TiSiN is deposited in operation S223. Then, as illustrated in FIG. 3D, an etching process for removing the rest nitride layer except for the nitride layer of the bottom electrode contact hole 301 may be performed in operation S224 to form the bottom electrode 300. After the nitride layer formed of TiN or TiSiN is deposited, a chemical etching process may be performed to remove the rest nitride layer except for the nitride layer that is disposed in a region in which the bottom electrode will be formed. As a result, the bottom electrode in which the nitride layer is formed in the bottom electrode contact hole may be formed.

After the bottom electrode 300 is formed through the chemical etching process, surface treating such as plasma cleaning using a $H_2$-contacing gas may be performed as illustrated in FIG. 3E. The surface treating for removing impurities (e.g., the natural oxide layer or carbon) generated or remaining on the surface of the substrate while the bottom electrode is formed may be performed. The surface treating may be performed through using the H2 plasma cleaning to remove the impurities such as the impurities. That is, since a switching rate of the PRAM is reduced due to the impurities remaining after the etching process, the $H_2$ plasma cleaning may be performed to remove the impurities.

However, when the surface treating is performed through using the $H_2$ plasma cleaning, bonding 350 of hydrogen H may be generated on the surfaces of the thin films as illustrated in FIG. 3F. When the phase-change layer 400 that is formed as a GST thin film is deposited by the PVD, an influence due to the bonding of the hydrogen H on the surfaces of the thin films may not be so large. However, when the phase-change layer 400 is deposited by the CVD, deposition characteristics due to the bonding of the hydrogen H on the surfaces of the thin films may be changed. That is, the deposition characteristics of the phase-change layer 400 due to the bonding of the hydrogen H on the surfaces of the thin films may be changed to significantly affect an incubation time and directivity, thereby having a bad influence on mass productivity.

To present the deposition characteristics from being changed by the hydrogen bonding that occurs by the H2 plasma cleaning, as illustrated in FIG. 3F, a surface nitriding process for removing the hydrogen bonding may be additionally performed after the $H_2$ plasma cleaning in operation S240.

As illustrated in FIG. 3G, the surface nitriding may be a pre-treating process for substituting the hydrogen bonding 350 that occurs on the top surfaces of the thin films by the H2 plasma cleaning with nitrogen bonding. Thus, the incubation time may be reduced, and the mass productivity may be improved.

The surface nitriding may be performed through two methods. That is, the surface nitriding may include annealing and plasma treating under nitrogen-containing atmosphere.

Figure 4:
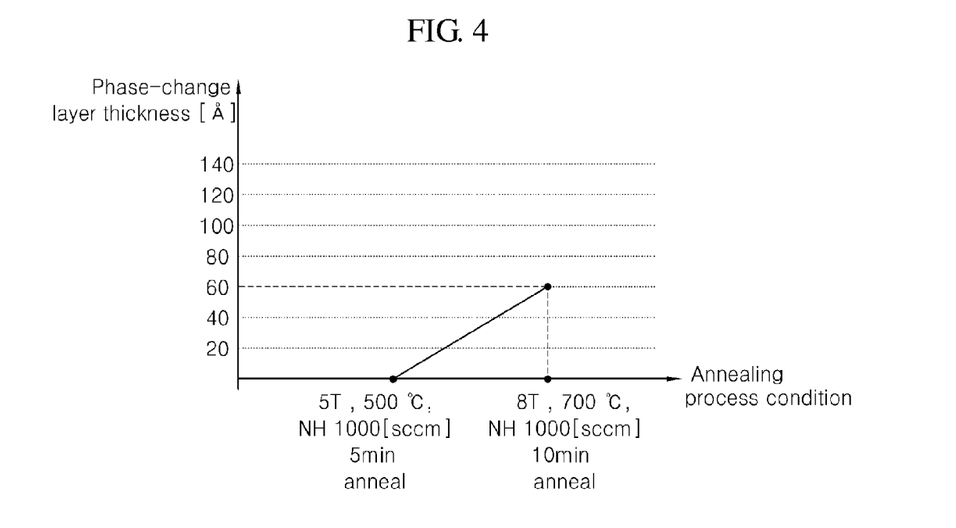
FIG. 4 is a graph illustrating a deposited thickness of the phase-change layer depending on annealing conditions in accordance with an exemplary embodiment.

In the surface nitriding using the annealing, a nitrogen-containing gas such as $NH_3$ may flow onto the top surfaces to perform the annealing. In the surface nitriding using the annealing, as temperature, time, and pressure for the annealing increase, the phase-change layer that is formed as the GST thin film to be deposited later may increase in thickness. FIG. 4 is a graph illustrating results obtained by measuring variation in thickness of the phase-change layer when the temperature, time, and pressure for the annealing increase while $NH_3$ having a flow rate of approximately 1000 sccm flows onto the top surface of the substrate.

Here, it is seen that the deposition of the phase-change layer starts in the annealing under conditions such as a temperature of approximately 500° C., a pressure of approximately 5 Torr, and a time of approximately 5 minutes, and the phase-change layer has a thickness of approximately 60 Å in the annealing under conditions such as a temperature of approximately 700° C., a pressure of approximately 8 Torr, and a time of approximately 10 minutes.

Figure 5:
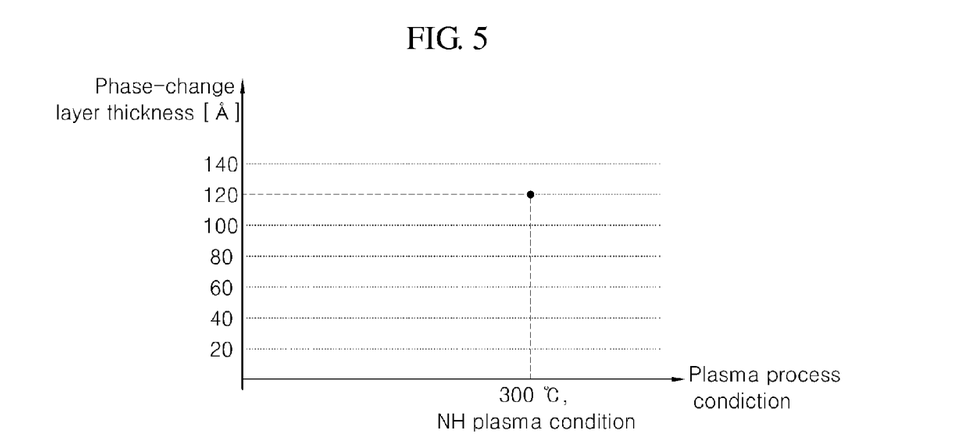
FIG. 5 is a graph illustrating a deposited thickness of the phase-change layer depending on plasma conditions in accordance with an exemplary embodiment.

In the surface nitriding using plasma, a nitrogen-containing gas such as $NH_3$ may be converted into a plasma gas to perform the surface treating. When the plasma treating is performed by using the nitrogen-containing gas at a temperature of approximately 300° C., as illustrated in FIG. 5, it is seen that the phase-change layer has a thickness of approximately 120 Å. That is, the phase-change layer may have a thickness greater than twice the thickness of the phase-change layer in the annealing under the conditions such as the temperature of approximately 700° C., the pressure of approximately 8 Torr, and the time of approximately 10 minutes. That is, it is seen that the plasma treating is performed at a temperature less than that for the annealing in the surface nitriding.

The annealing conditions may include a temperature of approximately 500° C. to approximately 900° C. and a pressure of approximately 1 Torr to approximately 100 Torr. If the annealing is performed under conditions less than the annealing conditions, nitriding reactivity may be reduced to deteriorate nitriding efficiency. Also, if the annealing is performed at a temperature greater than that of approximately 900° C., a lower layer may be lifted.

In the plasma conditions such as a temperature of approximately 500° C., a pressure of approximately 1 Torr to approximately 10 Torr, and a plasma treating time of approximately 1 minute to approximately 30 minutes, when the plasma time increases to a time greater than the plasma treating time according to the plasma conditions, the lower layer may be damaged.

After the surface treating (S240) is finished as described above, a process of depositing the phase-change layer 400 including a pure phase-change component, e.g., at least one of Ge, Sb, and Te on a top surface of the dielectric 200 including the bottom electrode is performed in operation S250.

One selected from 2-element compounds such as GaSb, InSb, InSe, $Sb_2Te_3$, and GeTe, 3-element compounds such as GeSbTe, GaSbTe, InSbTe, $SnSb_2Te_4$, and InSbTe, and 4-element compounds such as AgInSbTe, (GeSn)SbTe, GeSb(SeTe), and $Te_{81}Ge_{15}Sb2S_2$ may be used for forming the phase-change layer 400. In the current embodiment, a GST thin film including Ge, Sb and/or Te may be formed.

For example, the phase-changing layer 400 may have a thickness of approximately 1,000 Å to approximately 2,000 Å under a specific temperature condition through the CVD, ALD, or PVD. For example, when the phase-change layer 400 is formed through the CVD or ALD, the phase-change layer 400 may be formed at a temperature of approximately 150° C. to approximately 300° C. Also, when the phase-change layer 400 is formed through the PVD, the phase-change layer 400 may be formed at a temperature less than that in the CVD or ALD.

Also, the phase-change layer 400 may be deposited at a temperature of approximately 100° C. to approximately 210° C. so that the phase-change layer 400 has an amorphous state. In this case, the annealing may be successively performed after the phase-change layer is deposited. The annealing may be performed at a temperature of approximately 200° C. to approximately 300° C. so that the crystal of the phase-change layer 400 becomes to a stable state.

After the phase-change layer 400 is formed as described above, a top electrode is formed on the phase-change layer 230a in operation S260 as illustrated in FIG. 31. The top electrode may be formed as a Ti/TiN layer. For example, the Ti/TiN layer may be formed through the CVD.

Figure 6:
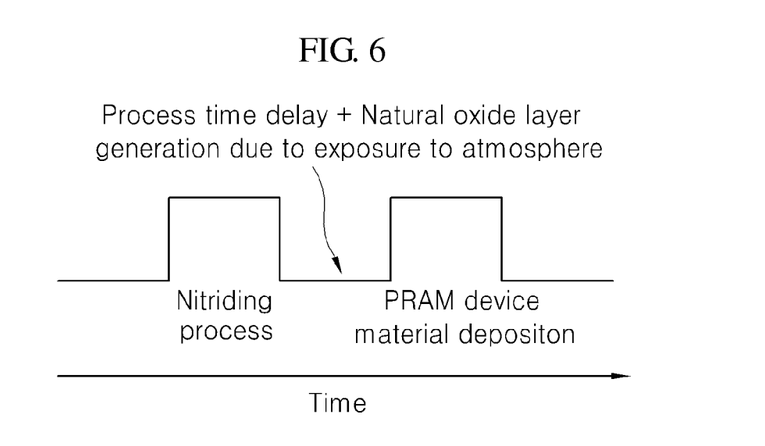
FIG. 6 is a time-variable graph illustrating a time delay before the phase-change layer is deposited after surface nitriding and a section in which a natural oxide layer due to the time delay is generated.

The phase-change layer such as the GST thin film may be deposited after the surface nitriding is performed as described above. In case of the existing phase-change layer (GST thin film) deposition equipment, an annealing device or plasma generation device for the surface nitriding may not be provided in the phase-change layer (GST thin film) deposition equipment. If the surface nitriding is performed through a separate single process by using the separate annealing device or plasma generation device, the time delay and natural oxide layer may occur as illustrated in FIG. 6.

Figure 7:
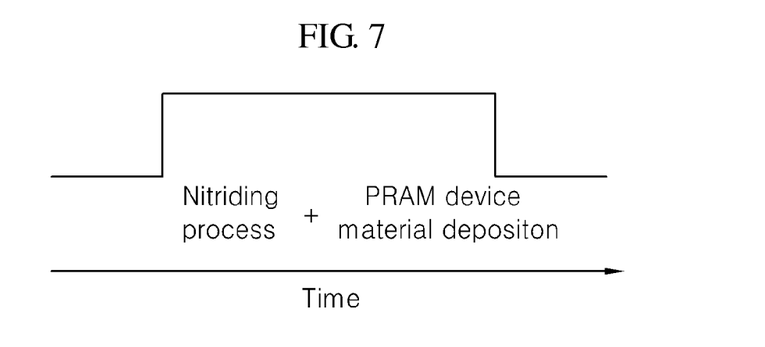
FIG. 7 is a time-variable graph when the surface nitriding and phase-change depositing are performed through a single process in accordance with an exemplary embodiment.

To prevent the natural oxide layer from forming, the surface nitriding and the phase-change layer depositing may be successively performed as illustrated in FIG. 7. For this, the substrate treating apparatus in which the surface nitriding and the phase-change layer depositing in accordance with an exemplary embodiment are performed at the same time will be described with reference to FIGS. 8 and 9.

Figure 8:
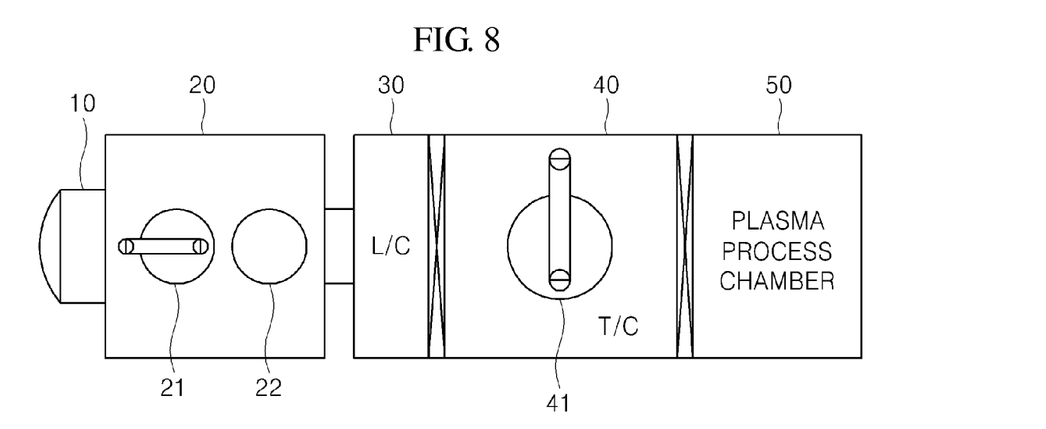
FIG. 8 is a view of a substrate treating apparatus in which the phase-change depositing and plasma surface nitriding are performed within a process chamber at the same time in accordance with an exemplary embodiment.

FIG. 8 is a view of a PRAM substrate treating apparatus in which the phase-change depositing and plasma surface nitriding are performed at the same time in accordance with an exemplary embodiment.

A substrate treating apparatus in accordance with an exemplary embodiment includes a loading box 10, a standby transfer chamber 20, a load lock chamber (L/C: 30), a vacuum transfer chamber (T/C: 40), and a plasma process chamber (P/C: 50). A cassette (not shown) in which a plurality of substrates are accommodated is disposed in the loading box 10.

A transfer arm 21 for transferring the substrates is disposed in the standby transfer chamber 20. Also, a buffering cassette 20 in which the substrates stand by for a moment is disposed in the standby transfer chamber 20. The load lock chamber 30 is configured to separate the standby transfer chamber 20 from the vacuum transfer chamber 40. The plurality of substrates within the buffering cassette 22 may be loaded into or unloaded from the load lock chamber 30. Also, the load lock chamber may be converted between an atmospheric state and a vacuum state. The vacuum transfer chamber 40 may have a polygonal shape such as a square shape. A substrate transfer robot 41 for transferring the substrates is disposed in the vacuum transfer chamber 40. The load lock chamber 30 is coupled to one of plural sides of the vacuum transfer chamber 40. Also, the inside of the vacuum transfer chamber 40 may be always maintained in the vacuum state except for a case of setting or maintaining/repairing.

The plasma process chamber 50 may be a process chamber in which a phase-change layer such as a GST thin film is deposited on a substrate through CVD or ALD. That is, in the plasma process chamber 50, a phase-change layer may be deposited on the substrate that is transferred from the vacuum transfer chamber by using germanium (Ge), antimony (Sb), or tellurium (Te) as a source gas through the CVD or ALD. Here, the plasma process chamber 50 may also be maintained in the vacuum state except for a specific case.

In the plasma process chamber 50, prior to the deposition of the phase-change layer on the substrate on which a bottom electrode is formed, plasma surface nitriding may be performed first on the substrate, on which the bottom electrode is formed, as a pre-treating process. For this, a plasma gas containing nitrogen N may be directly excited in a substrate treating space between a susceptor and a gas injection unit (e.g., a showerhead). Alternatively, the plasma gas may be supplied in a remote plasma generator (RPG) method in which the plasma gas is excited outside the chamber and then injected into the substrate treating space.

As described above, since the surface nitriding and the phase-change depositing are performed as an in-situ process within the same chamber that is the plasma process chamber 50 without transferring the substrate, a time delay may not occur until the phase-change layer is deposited after the nitriding to prevent a natural oxide layer from being formed.

Figure 9:
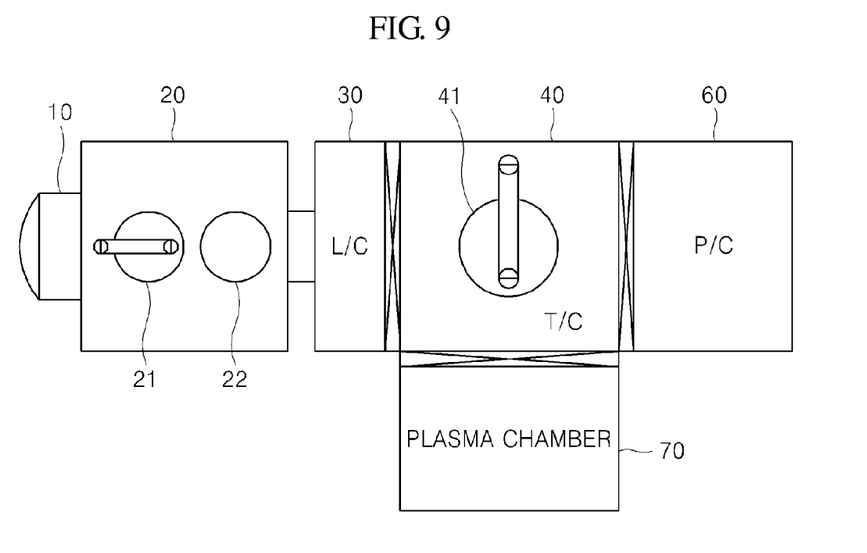
FIG. 9 is a view of a substrate treating apparatus including a separate plasma chamber in which surface nitriding is performed in accordance with an exemplary embodiment.

If the plasma treating for the surface nitriding is performed in a separate chamber except for the process chamber, as illustrated in FIG. 9, a plasma chamber 70 that is a nitriding chamber for the surface nitriding may be disposed around the vacuum transfer chamber.

In the case of the structure illustrated in FIG. 9, the substrate may be transferred into the plasma chamber 70 after being transferred into the process chamber 60 to perform the surface nitriding that is a pre-treating process on the substrate by using nitriding plasma. Then, the substrate may be transferred into the process chamber 60 via the vacuum transfer chamber 40, and the phase-change layer may be deposited on the substrate.

In the surface nitriding, an annealing in addition to the plasma treating may be performed to realize the surface nitriding. To perform the annealing, the susceptor may be heated at a temperature of approximately 700° C. or more as illustrated in FIG. 4. However, when the source gas and the reaction gas are deposited in the process chamber through the CVD or ALD, a unit for heating the susceptor may generally increase up to only a temperature of approximately 300° C. Thus, the surface nitriding through the annealing may not be performed in the existing process chamber.

Figure 10:
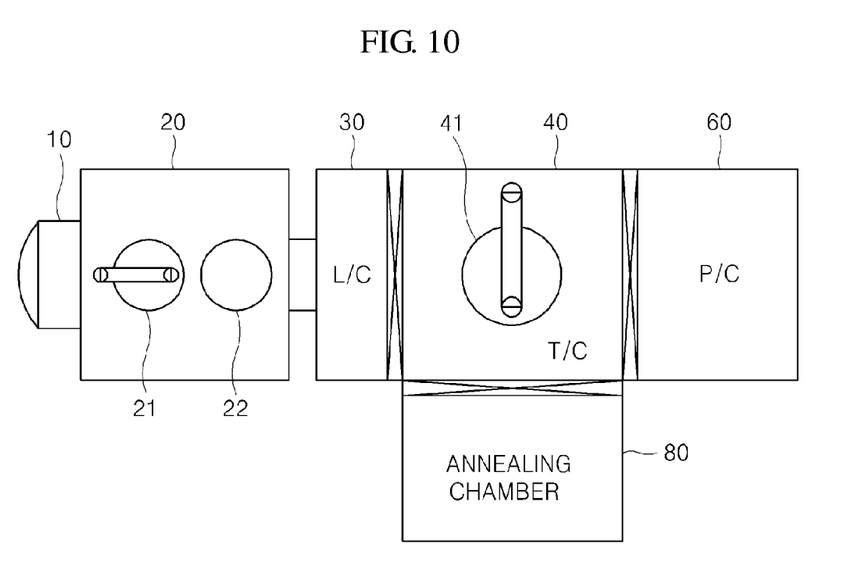
FIG. 10 is a view of a substrate treating apparatus including a separate annealing chamber in which surface nitriding is performed in accordance with an exemplary embodiment.

Therefore, to perform the surface treating through the annealing before the phase-change layer is deposited in the process chamber, a separate annealing chamber 80 that serves as the nitriding chamber may be provided as illustrated in FIG. 10. The annealing chamber 80 may be a chamber in which a temperature (e.g., approximately 700° C.) adequate for performing the surface nitriding is provided. The annealing chamber 80 may be disposed on a side of plural sides of the vacuum transfer chamber 40.

In the case of the structure illustrated in FIG. 10, the substrate may be transferred into the annealing chamber 80 after being transferred into the process chamber 60 to perform the surface nitriding that is a pre-treating process on the substrate through the annealing. Then, the substrate may be transferred into the process chamber 60 via the vacuum transfer chamber 40.

According to the exemplary embodiment, the deposition characteristics of the phase-change layer in the phase-change memory may not be changed by the plasma cleaning process that is performed on the bottom electrode. Since the incubation time and directivity of the phase-change layer are not affected even though the plasma cleaning process is performed on the bottom electrode, the mass productivity of the phase-change memory may be improved. Also, according to the exemplary embodiment, the nitriding and phase-change depositing may be performed through the single process to prevent the natural oxide layer from being generated, thereby improving the characteristics of the phase-change memory.

Although the substrate treating apparatus and method have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A substrate treating method for manufacturing a phase-change memory, the substrate treating method comprising:
   forming a bottom electrode on a substrate on which a pattern is formed;
   performing surface treating through plasma treating using an H$_2$-containing gas for removing impurities generated or remaining on a surface of the substrate while the bottom electrode is formed;
   performing nitriding to remove hydrogen bonding generated on the surface of the substrate from which the impurities are removed; and
   successively depositing a phase-change layer and a top electrode on the bottom electrode,
   wherein the nitriding comprises substituting nitrogen bonding for the hydrogen bonding attached to the surface of the substrate during the surface treating.

2. The substrate treating method of claim 1, wherein the forming of the bottom electrode comprises:
   forming a bottom electrode contact hole in which the bottom electrode is formed after a dielectric is deposited on the substrate;
   depositing a nitride layer on the surface of the substrate in which the contact hole is formed; and
   removing the nitride layer remaining except for the nitride layer formed in the bottom electrode contact hole.

3. The substrate treating method of claim 1, wherein the nitriding comprises annealing or plasma treating under a nitrogen-containing atmosphere.

4. The substrate treating method of claim 3, wherein the annealing is performed by allowing at least one of N2, N2O, and NH3 to flow.

5. The substrate treating method of claim 4, wherein the annealing is performed under conditions such as a pressure of approximately 8 Torr or more and a temperature of approximately 700° C. or more.

6. The substrate treating method of claim 4, wherein the annealing is performed by allowing at least one of N2, N2O, and NH3 to flow at a flow rate of approximately 1000 sccm for approximately 10 minutes.

7. The substrate treating method of claim 3, wherein the plasma treating is performed by generating a plasma from at least one of N2, N2O, and NH3.

8. The substrate treating method of claim 7, wherein the plasma treating is performed at a temperature of approximately 300° C.

9. The substrate treating method of claim 1, wherein the phase-change layer is formed of a compound comprising at least one of germanium (Ge), antimony (Sb), or tellurium (Te).

10. The substrate treating method of claim 9, wherein the phase-change layer is formed of a 2-element compound.

11. The substrate treating method of claim 1, wherein each of the bottom electrode and the top electrode is formed of a nitrogen-containing compound.

12. The substrate treating method of claim 9, wherein the phase-change layer is formed of a 3-element compound.

13. The substrate treating method of claim 9, wherein the phase-change layer is formed of a 4-element compound.

* * * * *